(12) United States Patent
Bol

(10) Patent No.: US 6,858,499 B2
(45) Date of Patent: Feb. 22, 2005

(54) METHOD FOR FABRICATION OF MOSFET WITH BURIED GATE

(75) Inventor: Igor Bol, Sherman Oaks, CA (US)

(73) Assignee: International Rectifier Corporation, El Segundo, CA (US)

( * ) Notice: Subject to any disclaimer, the term of this patent is extended or adjusted under 35 U.S.C. 154(b) by 155 days.

(21) Appl. No.: 10/404,989

(22) Filed: Mar. 31, 2003

(65) Prior Publication Data
US 2004/0191971 A1 Sep. 30, 2004

Related U.S. Application Data

(62) Division of application No. 09/593,447, filed on Jun. 19, 2000, now Pat. No. 6,570,218.

(51) Int. Cl.$^7$ .............................................. H01L 21/336
(52) U.S. Cl. ........................................ 438/268; 257/328
(58) Field of Search ................................ 438/138, 201, 438/211, 268, 587; 257/327–331

(56) References Cited

U.S. PATENT DOCUMENTS

| | | | | |
|---|---|---|---|---|
| 5,233,215 A | * | 8/1993 | Baliga | 257/490 |
| 5,554,862 A | * | 9/1996 | Omura et al. | 257/137 |
| 6,069,043 A | * | 5/2000 | Floyd et al. | 438/270 |
| 6,075,269 A | | 6/2000 | Terasawa et al. | 257/330 |
| 6,172,398 B1 | | 1/2001 | Hshieh | 257/330 |
| 6,262,470 B1 | | 7/2001 | Lee et al. | 257/330 |
| 2002/0038886 A1 | | 4/2002 | Mo | 257/330 |

* cited by examiner

Primary Examiner—David Nelms
Assistant Examiner—David Vu
(74) Attorney, Agent, or Firm—Ostrolenk, Faber, Gerb & Soffen, LLP

(57) ABSTRACT

An insulation is formed on a substrate of a material having a first conductivity type. A gate material is formed on the insulation. A portion of the gate material is removed thereby creating forming mesa type gate structures from remaining positions of the gate material. The mesas are then insulated. A channel forming layer, of a material having a second conductivity type, is formed between the produced mesas. Finally, a source of a material having the first conductivity type is formed on the channel forming layer.

7 Claims, 3 Drawing Sheets

US 6,858,499 B2

METHOD FOR FABRICATION OF MOSFET WITH BURIED GATE

RELATED APPLICATION

This is a divisional of U.S. patent application Ser. No. 09/593,447, filed Jun. 19, 2000 now U.S. Pat. No. 6,570,218 in the name of Igor Bol and entitled MOSFET WITH A BURIED GATE.

FIELD OF THE INVENTION

This invention relates to semiconductor fabrication technology and products and specifically to the production of an insulated gate, vertical MOSgated transistor ("MOSFET") using a mesa-type buried gate.

BACKGROUND OF THE INVENTION

MOSgated devices are well known and include such devices as power MOSFETS, IGBTs, gate controlled thyristors and the like. In these devices, a source and drain layer are connected by a channel layer. A MOSgate forms a depletion region in the channel layer thereby allowing or preventing movement of carriers through the channel from the source to the drain.

In such devices, the gate and the channel region are either lateral or vertical relative to the plane of the channel. So called trench devices employ a vertical channel. Generally, this requires plural spaced narrow deep trenches into the semiconductor device substrate. A gate oxide lines the walls of the trench and the trench is then filled with a conductive polysilicon gate electrode filler.

Trench type MOSgated devices and have a low gate capacitance which is very useful in many low voltage applications. However, their fabrication is difficult and expensive, particularly due to the need to etch the deep trenches and fill them with a polysilicon gate filler. This process is complicated by the need for plural mask steps which must be aligned with great accuracy.

Therefore, there exists a need in the art for a method of inexpensively manufacturing a MOSgated device which does not require etching deep, narrow trench in silicon.

SUMMARY OF THE INVENTION

In accordance with the invention, a MOSgated device, such as a MOSFET, is formed by first depositing a conductive polysilicon layer atop and insulated from a silicon substrate and then etching away portions of the polysilicon thereby leaving polysilicon mesa-type structures which will act as gate structures. A gate oxide is then formed along the vertical sides of the polysilicon mesa structures. The space between the polysilicon mesas is then filled with epitaxially deposited silicon (which defines the channel regions) and their tops receive source regions and are enclosed by an insulation oxide. Source contents are then connected to the source regions and channel regions and a drain contact is connected to the bottom of the substrate. Thus, with the novel fabrication process of the invention, a novel MOSgated device can be formed with simple, well known process steps etching the polysilicon layer and not the silicon. Moreover, the technique of the invention only requires the use of only three masks with no critical alignment thus reducing cost and increasing reliability of the process.

BRIEF DESCRIPTION OF THE DRAWING(S)

For the purpose of illustrating the invention, there is shown in the drawings a form which is presently preferred, it being understood, however, that the invention is not limited to the precise arrangements and instrumentalities shown.

DETAILED DESCRIPTION OF THE INVENTION

Figure 1:
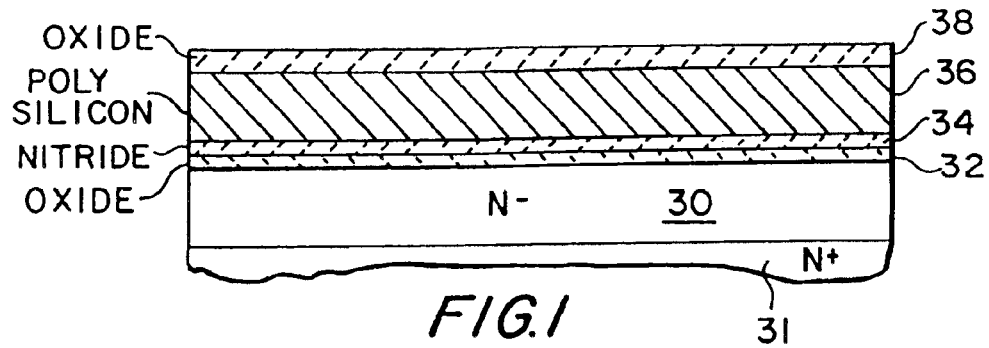
FIG. 1 is a cross-section of a starting $n^+$ doped monocrystaline silicon wafer with an $n^-$ epi layer, a deposited insulation layer, a polysilicon layer atop the insulation layer and an oxide layer atop the polysilicon layer.

Referring first to FIG. 1 and in accordance with the invention, an $N^+$ bulk silicon substrate 31 receives an $N^-$ epitaxially grown silicon layer 30. A first silicon dioxide ("oxide") layer 32 having a thickness of approximately 200 Å is grown on $N^-$ layer 30. It is to be noted that thicknesses are not shown to scale for purposes of clarity.

A silicon nitride ("nitride") layer 34 having a thickness of approximately 500 Å is next deposited oxide layer 32. A conductive polycrystalline silicon ("polysilicon") layer 36 having a thickness of approximately 1.5 μm is deposited on nitride layer 34 and will eventually form the gate of the device. Finally, a second oxide layer 38 having a thickness of about 2500 Å is grown on polysilicon layer 36. First oxide layer 32 and nitride layer 34 thus insulate substrate 30 and polysilicon 36. The five layers comprise a core upon which numerous processes can be carried out.

Note that the term "die" is interchangeably used with "wafer" in which a plurality of identical die are simultaneously formed. The full wafer is processed as shown in FIG. 1. The steps next described are described for a single cell element of any die on the wafer. Any desired topology can be used.

Figure 2:
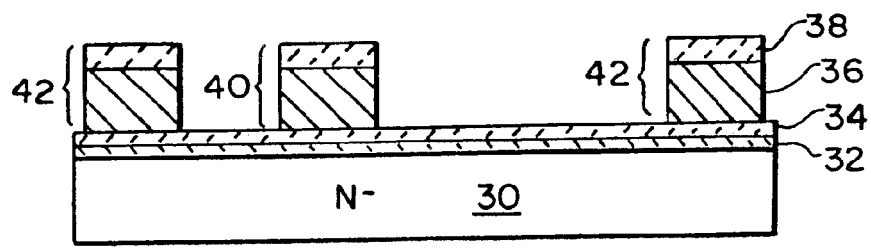
FIG. 2 is a cross-section of a die in the wafer of FIG. 1 for one small portion of the die, showing the etched polysilicon to form gate mesas after a first mask step.

Referring now to FIG. 2, a first photoresist mask step is designed to so that it demarcates mesas 40, 42 which are to be formed in the five layer structure. Using a first non-critically aligned photoresist and mask step, oxide layer 38 and polysilicon layer are etched, forming the mesas 40 and 42. The etch is stopped at nitride layer 34.

Figure 3:
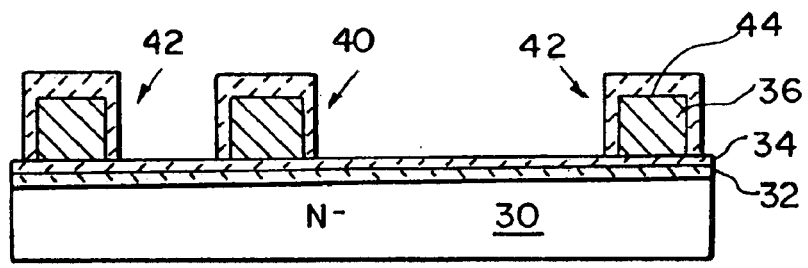
FIG. 3 shows the next step in the process of the invention in which the side walls of the polysilicon mesas have received a gate oxide.
Figure 4:
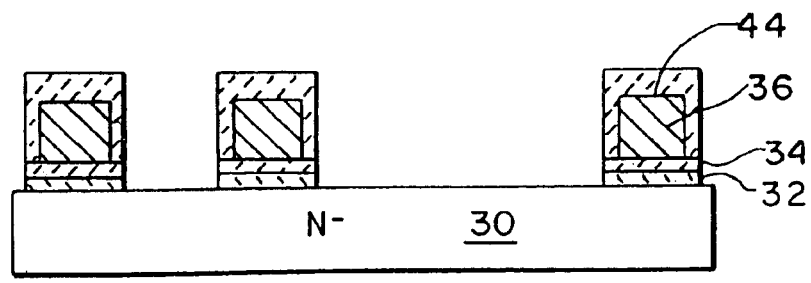
FIG. 4 shows the next step of the invention in which the bottom nitride and oxide layers spanning between the bottoms of the polysilicon mesas are etched away.

Referring next FIG. 3 an oxide layer 44 is grown atop and around mesas 40 and 42. Oxide layer 44 has a thickness of approximately 800 Å and grows atop the side surfaces of mesas 40 and 42 and atop layer 38 of FIG. 2. Thereafter, and as shown in FIG. 4, nitride layer 34 and oxide layer 32, which are disposed between mesas 40 and 42, are removed. The nitride removal can be performed by plasma etching while the oxide removal can be performed by any desired acid etch.

Figure 5:
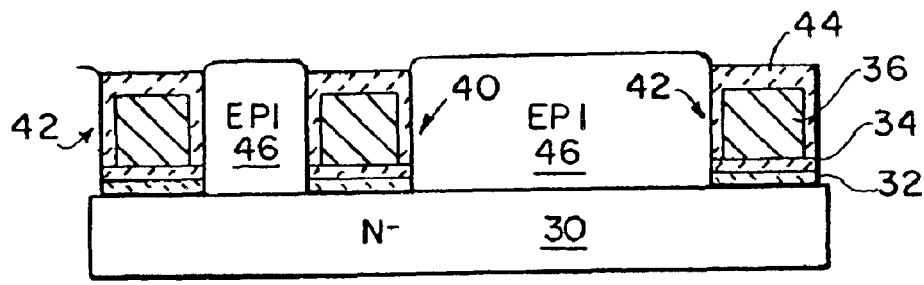
FIG. 5 shows the next step in the process of the invention in which p doped silicon is epitaxially grown onto the exposed silicon between the bottoms of the mesas.

Referring next to FIG. 5, P type epitaxial silicon 46 is formed between mesas 40 and 42 and atop the exposed silicon between the mesas.

Figure 6:
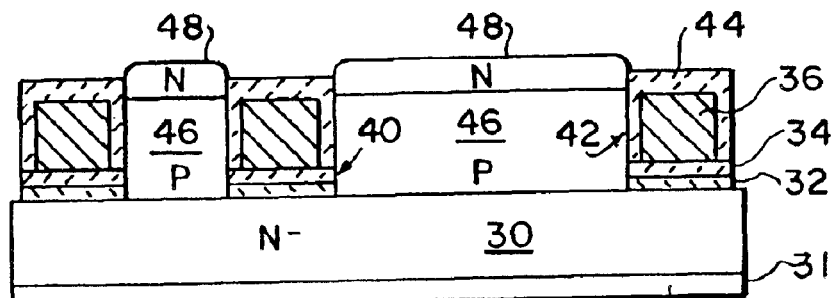
FIG. 6 shows the next step in the process of the invention in which an N type implant is formed in the top surface of the epitaxial silicon.

As next shown in FIG. 6, a blanket implant of arsenic (or any other N type impurity species) is applied to the top of the device. This forms an N$^+$ layer 48 on top of channel region 46 (which will later become the source regions of the device). The arsenic implant may have a dose of $6 \times 10^{15}$ ions/cm$^2$ and may be suitably activated.

Figure 7:
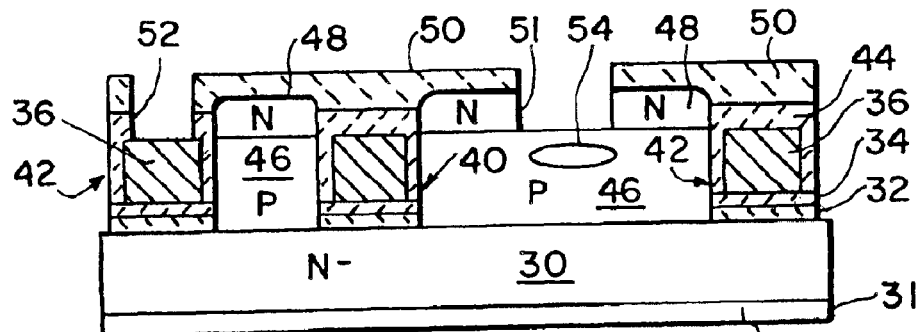
FIG. 7 shows the next step in the process of the invention in which a low temperature oxide (LTO) is deposited atop the top of the die and following a second mask step and the etch of the LTO and the underlying N type diffusion.

Referring next to FIG. 7, an LTO layer 50, which is 6000 Å thick, is deposited over the top of the device. A second photoresist mask step is next used to define window 51 in LTO 50 to N$^+$ source region 48 between mesas 40 and 42 and a window 52 to polysilicon gate 36. A boron implant 54 is applied through window 51 and into channel region 46 with a dosage of $1 \times 10^{15}$ ions/cm$^2$. Boron implant 54 is then driven at a high temperature so that it diffuses within channel region 46 as shown in FIG. 8 to form a contact diffusion.

Figure 8:
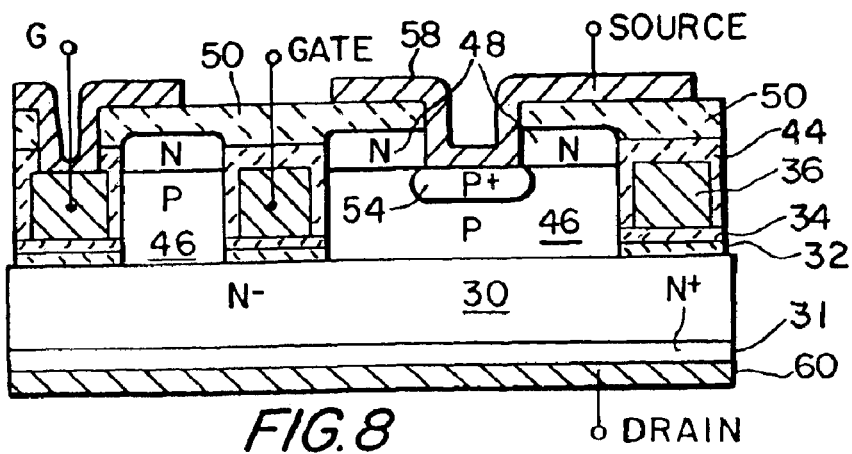
FIG. 8 shows the next step in the process of the invention in which metal is deposited atop the die and then patterned in a third non-critical metal mask step, completing a single typical cell of the die.

As next shown in FIG. 8, source metal layer 58 is deposited on top of the entire device and forms a source contact terminal for the MOSFET. A drain electrode 60 is connected to N$_+$ substrate 31. Polysilicon mesas 36 are all coupled together and form the gate electrode of the MOSFET.

Figure 8A:
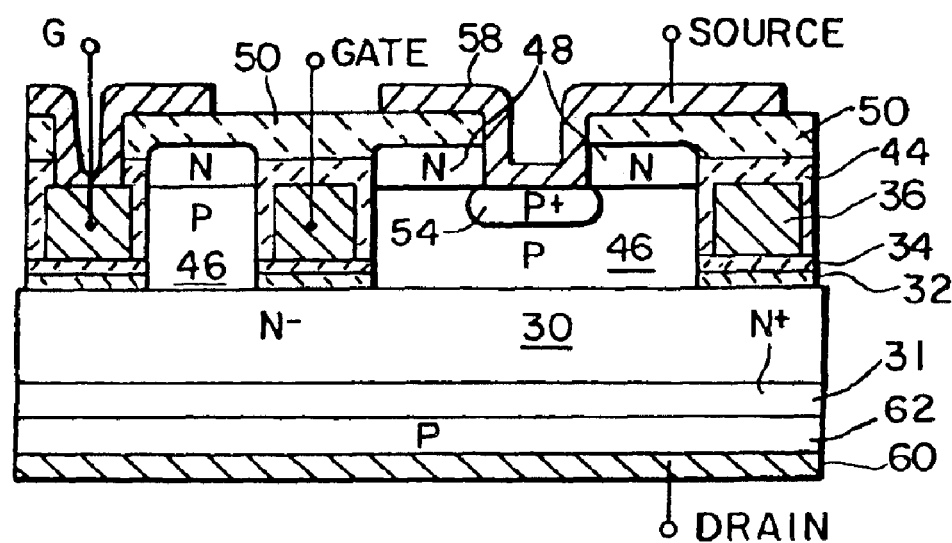

As will be appreciated by those skilled in the art, that the device could also function as an IGBT if an extra P type collector layer 62 is added beneath N$^+$ layer 31, as illustrated in FIG. 8A.

In operation, a positive gate voltage on polysilicon gate 36 will induce an N type channel in P mesas 46 vertically along the walls of oxide layer 44. Thus, electron current can flow between source 58 and drain 60. This conduction path is turned off when the gate voltage is removed.

As can be discerned, then invention provides a simpler, less costly method of semiconductor manufacturing. The process requires only 3 masking steps only one of which is critical which reduces costs. The channel produced is self-aligned and reduces channel capacitance. There is no gate to N$^+$ overlap as in prior art techniques where the gate reaches into the drain, and so gate to drain capacitance is reduced.

Although an N channel MOSFET is described, clearly the conductivity layers can be interchanged to produce a P channel MOSFET.

The use of a polysilicon etch, in contrast to the prior art silicon trench etch is a much simpler process for the manufacture of a trench-type MOSFET. Note that, self aligned silicidation can be used to reduce $R_{DSON}$. Further, better performance than that of the trench device can be obtained because carrier mobility is higher due to the trench etch.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A method of manufacturing a semiconductive device, said method comprising:

providing a substrate having a first conductivity type;

forming a first insulator layer on said substrate;

forming gate material on said first insulator;

providing a first mask;

removing portions of said gate material dictated by said first mask, thereby creating mesas out of said gate material from remaining portions of said gate material;

depositing a second insulator layer around said gate material;

forming a channel forming layer of a material having a second conductivity type on said substrate and in between said mesas; and depositing a source layer having said first conductivity type on said channel forming layer.

2. The method as claimed in claim 1, further comprising:

depositing a third insulator layer on a top portion of said semiconductive device;

providing a second mask; and removing portions of said third insulator dictated by said second mask thereby creating an opening in said third insulator and providing access to said channel layer.

3. The method as claimed in claim 2, further comprising:

placing an implant of said second conductivity type through said opening and into said channel layer; and diffusing said implant.

4. The method as claimed in claim 3, further comprising:

depositing a contact layer on top of said semiconductive device.

5. The method as claimed in claim 4, further comprising:

depositing a collector layer beneath said substrate.

6. The method as claimed in claim 1, further comprising:

depositing a collector layer below said substrate.

7. The method as claimed in claim 1, further comprising depositing a third insulator on said gate material before performing said providing a first mask.

* * * * *